United States Patent
Kim et al.

(10) Patent No.: US 11,702,349 B2
(45) Date of Patent: Jul. 18, 2023

(54) ELECTROMAGNETIC-WAVE-ABSORBING PARTICLE FOR GHZ BAND AND ELECTROMAGNETIC-WAVE-ABSORBING MATERIAL INCLUDING THE SAME

(71) Applicants: HYUNDAI MOTOR COMPANY, Seoul (KR); KIA MOTORS CORPORATION, Seoul (KR); KOREA NATIONAL UNIVERSITY OF TRANSPORTATION Industry-Academic Cooperation Foundation, Chungju-si (KR)

(72) Inventors: Hyung Suk Kim, Gwangmyeong-si (KR); Eun Soo Lim, Pyeongtaek-si (KR); Ji Eun Yoo, Yangju-si (KR); Young Min Kang, Chungju-si (KR)

(73) Assignees: HYUNDAI MOTOR COMPANY, Seoul (KR); KIA MOTORS CORPORATION, Seoul (KR); KOREA NATIONAL UNIVERSITY OF TRANSPORTATION INDUSTRY-ACADEMIC COOPERATION FOUNDATION, Chungju-si (KR)

( * ) Notice: Subject to any disclaimer, the term of this patent is extended or adjusted under 35 U.S.C. 154(b) by 297 days.

(21) Appl. No.: 17/158,334

(22) Filed: Jan. 26, 2021

(65) Prior Publication Data
US 2022/0064018 A1   Mar. 3, 2022

(30) Foreign Application Priority Data
Aug. 25, 2020 (KR) .................. 10-2020-0107195

(51) Int. Cl.
*C01G 49/00* (2006.01)
*C08K 3/22* (2006.01)
(Continued)

(52) U.S. Cl.
CPC ............ *C01G 49/0063* (2013.01); *C08K 3/04* (2013.01); *C08K 3/22* (2013.01); *H05K 9/0081* (2013.01);
(Continued)

(58) Field of Classification Search
CPC ...... H05K 9/0081; C01G 51/70; C01G 51/66; C01G 49/0018; C01G 49/0036;
(Continued)

(56) References Cited

U.S. PATENT DOCUMENTS

| | | | |
|---|---|---|---|
| 9,338,932 B2* | 5/2016 | Hirose | C01G 49/0009 |
| 2004/0151661 A1* | 8/2004 | Tenaud | C04B 35/2633 |
| | | | 423/594.2 |
| 2004/0251997 A1* | 12/2004 | Morel | C01G 49/009 |
| | | | 335/302 |

FOREIGN PATENT DOCUMENTS

| | | |
|---|---|---|
| KR | 10-2013-0126510 A | 11/2013 |
| KR | 10-2015-0048256 A | 5/2015 |
| KR | 10-2011343 A | 8/2019 |

\* cited by examiner

*Primary Examiner* — Andrew J. Oyer
(74) *Attorney, Agent, or Firm* — Morgan, Lewis & Bockius LLP

(57) ABSTRACT

Electromagnetic-wave-absorbing particles for a GHz band are represented by the following [Empirical Formula 1] and include M-type hexaferrite as a major phase:

$$Sr_{1-x}R_xFe_{y-2z}M_{2z}O_a, \quad \text{[Empirical Formula 1]}$$

where R is one or more selected from Ba, Ca, and La, M is one or more selected from Zn, Ti, and Zr, $0<x\leq0.8$, $8\leq y\leq14$, $0<z\leq1.5$, and a is 19.

11 Claims, 11 Drawing Sheets

(51) Int. Cl.
 *C08K 3/04* (2006.01)
 *H05K 9/00* (2006.01)
(52) U.S. Cl.
 CPC .. *C01P 2002/52* (2013.01); *C08K 2003/2296* (2013.01); *C08K 2201/014* (2013.01)
(58) Field of Classification Search
 CPC .... C08K 3/04; C08K 3/22; C08K 2003/2237; C08K 2003/2265; C08K 2003/2289; C08K 2201/014; C01P 2002/50; C01P 2002/76; C01P 2002/52; C01P 2006/42; C01P 2006/40; H01F 1/348; H01Q 17/004; C01B 32/20
 See application file for complete search history.

ELECTROMAGNETIC-WAVE-ABSORBING PARTICLE FOR GHZ BAND AND ELECTROMAGNETIC-WAVE-ABSORBING MATERIAL INCLUDING THE SAME

CROSS REFERENCE TO RELATED APPLICATION

The present application claims the benefit of priority to Korean Patent Application No. 10-2020-0107195, filed Aug. 25, 2020 in the Korean Intellectual Property Office, the entire content of which is incorporated herein for all purposes by this reference.

TECHNICAL FIELD

The present disclosure relates to electromagnetic-wave-absorbing particles for a GHz band and an electromagnetic-wave-absorbing material including the same. More particularly, the present disclosure relates to electromagnetic-wave-absorbing particles for a GHz band, which are capable of absorbing electromagnetic waves through a magnetic loss mechanism caused by a spin vibration in the GHz band, and to an electromagnetic-wave-absorbing material including the same.

BACKGROUND

Various electric and electronic parts are used in vehicles, and thus a problem of electromagnetic wave interference occurs.

Therefore, in vehicles, a material capable of blocking electromagnetic waves is used in parts that surround parts generating electromagnetic waves and parts to be protected from electromagnetic waves.

Parts applied to conventional vehicles are protected by blocking electromagnetic waves. However, electromagnetic waves are unnecessarily reflected in the process of blocking the electromagnetic waves, which adversely affects other parts.

Accordingly, technology related thereto has been studied based on the fact that when the electromagnetic waves are blocked, that is, when the electromagnetic waves are not reflected but absorbed, it is possible to prevent the occurrence of adverse effects in other parts of vehicles.

Further, in recent years, as interest in autonomous cars has increased, in-vehicle radar technologies and wireless communication technologies such as those related to 5G have been applied so as to enable autonomous driving of vehicles. The frequency band of the electromagnetic wave that is used in the technologies has been gradually increased, so a high frequency in a band of several to tens of GHz is used.

Accordingly, research on materials capable of absorbing electromagnetic waves in a band of several to tens of GHz is required.

Conventionally, a technology for mixing carbon-based powders (such as those based on graphite, carbon black, carbon nanotubes, or carbon fiber) and metal-based powders, as an absorbing body that absorbs electromagnetic waves in a band of tens of GHz, with a polymer resin so that the electromagnetic waves are absorbed through a conductive mechanism has been used in and applied to parts of vehicles.

However, these types of parts have a limitation in the absorption ability of electromagnetic waves because of an absorption mechanism according to dielectric or conductive loss, and there is a possibility of scattering caused by reflected waves, so that the electromagnetic waves cannot be fundamentally eliminated.

Further, electromagnetic-wave-absorbing bodies using Mn—Zn-based ferrite and Ni—Zn-based ferrite have been developed as an absorbing body using magnetic powder. However, the absorbing bodies lose almost all magnetic permeability values at a high frequency in a GHz band to the extent of being similar to the relative magnetic permeability in a vacuum. Therefore, the above absorbing bodies do not serve as an effective absorbing body in a band of tens of GHz.

The content described as the background art is only for understanding the background of the present disclosure, and should not be taken as acknowledging that it corresponds to the prior art already known to those of ordinary skill in the art.

SUMMARY

The present disclosure provides electromagnetic-wave-absorbing particles for a GHz band, which are capable of absorbing electromagnetic waves through a magnetic loss mechanism caused by a spin vibration, and an electromagnetic-wave-absorbing material including the same.

Electromagnetic-wave-absorbing particles for a GHz band according to an embodiment of the present disclosure may be represented by the following [Empirical Formula 1] and include M-type hexaferrite as a major phase:

$$Sr_{1-x}R_xFe_{y-2z}M_{2z}O_a, \quad \text{[Empirical Formula 1]}$$

where R is one or more selected from Ba, Ca, and La, M is one or more selected from Zn, Ti, and Zr, $0<x\le0.8$, $8\le y\le14$, $0<z\le1.5$, and a is 19.

The electromagnetic-wave-absorbing particles are represented by the following [Empirical Formula 2]:

$$Sr_{1-x}R_xFe_{y-2z}Zn_zTi_zO_{19}, \quad \text{[Empirical Formula 2]}$$

where R is one or more selected from Ba, Ca, and La, $0<x\le0.8$, $8\le y\le14$, and $0<z\le1.5$.

When the value of z is 0.6, the electromagnetic-wave-absorbing particles maximally absorb electromagnetic waves in a band of 9 to 10.5 GHz.

The electromagnetic-wave-absorbing particles have a value of x 0.094 to 0.15.

An electromagnetic-wave-absorbing material for a GHz band according to another embodiment of the present disclosure includes a polymer resin, and electromagnetic-wave-absorbing particles, which are mixed with the polymer resin, are represented by the following [Empirical Formula 1], and include M-type hexaferrite as a major phase:

$$Sr_{1-x}R_xFe_{y-2z}M_{2z}O_a, \quad \text{[Empirical Formula 1]}$$

where R is one or more selected from Ba, Ca, and La, M is one or more selected from Zn, Ti, and Zr, $0<x\le0.8$, $8\le y\le14$, $0<z\le1.5$, and a is 19.

The electromagnetic-wave-absorbing particles are represented by the following [Empirical Formula 2]:

$$Sr_{1-x}R_xFe_{y-2z}Zn_zTi_zO_{19}, \quad \text{[Empirical Formula 2]}$$

where R is one or more selected from Ba, Ca, and La, $0<x\le0.8$, $8\le y\le14$, and $0<z\le1.5$.

A permittivity-adjusting agent is further added to the electromagnetic-wave-absorbing material.

The permittivity-adjusting agent is graphite.

The permittivity-adjusting agent is contained in an amount of 5.0 wt % or less based on 100 wt % of the mass of the electromagnetic-wave-absorbing particles.

The electromagnetic-wave-absorbing material absorbs electromagnetic waves in a band of 24 GHz.

A reaction accelerator for accelerating a reaction of the permittivity-adjusting agent is further added to the electromagnetic-wave-absorbing material.

The reaction accelerator is contained in an amount of 6.0 to 7.0 wt % based on 100 wt % of the mass of electromagnetic-wave-absorbing particles.

According to the embodiments of the present disclosure, M-type hexaferrite is used as absorbing particles, and the high ferromagnetic resonance frequency of the GHz band is used due to the high crystal magnetic anisotropy of the absorbing particles. Thereby, it is possible to absorb electromagnetic waves through a mechanism of magnetic loss (increase in the imaginary-number part of magnetic permeability caused by a spin vibration up to a band of tens of GHz or more.

Further, an adjusting agent for adjusting permittivity is contained in an absorbing material including electromagnetic-wave-absorbing particles including M-type hexaferrite as a major phase. Accordingly, it is possible to absorb electromagnetic waves in the desired band.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Hereinafter, embodiments of the present disclosure will be described in more detail with reference to the accompanying drawings. However, the present disclosure is not limited to the embodiments disclosed below, but will be implemented in various different forms. These embodiments are provided to complete the disclosure of the present disclosure and to fully inform a person of ordinary skill of the scope of the disclosure.

An electromagnetic-wave-absorbing material for a GHz band according to an embodiment of the present disclosure is obtained by mixing absorbing particles including M-type hexaferrite as a major phase with a polymer resin.

In addition, a permittivity-adjusting agent for adjusting permittivity may be further added to the electromagnetic-wave-absorbing material.

The absorbing particles are represented by the following [Empirical Formula 1].

[Empirical Formula 1]

In Empirical Formula 1, R is one or more selected from Ba, Ca, and La, M is one or more selected from Zn, Ti, and Zr, $0<x\leq0.8$, $8\leq y\leq14$, $0<z\leq1.5$, and a is 19.

R necessarily includes one or more of Ba, Ca, and La, and may also include a rare-earth element that may be substituted at the Sr site.

In addition, M is a potential metal that may be substituted at the Fe site, and the value of y−2z is the content of Fe that maintains a hexagonal system as a major phase. It is preferable to maintain $8\leq y\leq14$ and $0<z\leq1.5$.

The value of a, which is an oxygen content, is an important factor in maintaining a hexagonal system, and it is preferable that the value of a be maintained at about 19.

The absorbing particles may be represented by the following [Empirical Formula 2], in which Zn and Ti are selected as M.

[Empirical Formula 2]

With the above composition, it is possible to absorb electromagnetic waves of a desired frequency range in a band of several to tens of GHz.

Next, a process of deriving [Empirical Formula 1] as described above will be described.

First, the magnetic resonance frequency corresponding to the frequency at which an absorption rate is maximum follows [Snoek's law] below.

[Snoek's law]

$$(\mu_s - 1)f_r = \frac{2}{3}\gamma \times 4\pi M_s \quad \text{[Snoek's law]}$$

In [Snoek's law], $\mu_s$ means magnetic permeability, $\gamma$ means gyromagnetic ratio, $M_s$ means saturation magnetization, and $f_r$ means magnetic resonance frequency.

Since the gyromagnetic ratio of a material is a constant according to the characteristics of the material, and $f_r$ (magnetic resonance frequency) is determined by a saturation magnetization value ($M_s$) and the value of ($\mu_s$−1).

Therefore, in [Empirical Formula 1], after the value of x was fixed to 0.094 and the value of y was fixed to 11, the values of $M_s$ and $\mu_s$ in the composition for which the value of z was changed were measured through BH curve measurement.

In addition, $f_r$ (magnetic resonance frequency) at which the absorption rate of the electromagnetic wave was maximized for each sample was derived through Snoek's Law, and the results are shown in Table 1 below.

TABLE 1

| Classification (No.) | z | $\mu_s - 1$ | $f_r$ | $(\mu_s - 1)f_r$ | $M_s$ | $\frac{(\mu_s - 1)}{f_r / M_s}$ |
|---|---|---|---|---|---|---|
| 1 | 0 | 0.242 | 14.56 | 3.52352 | 2000 | 0.00176176 |
| 2 | 0 | 0.036 | >50 | 3.06 | 2000 | 0.00153 |
| 3 | 0.8 | 0.076 | 40 | 3.04 | 1660 | 0.00183133 |

TABLE 1-continued

| Classification (No.) | z | $\mu_s - 1$ | $f_r$ | $(\mu_s - 1)f_r$ | $M_s$ | $\dfrac{(\mu_s - 1)}{f_r/M_s}$ |
|---|---|---|---|---|---|---|
| 4 | 1 | 0.154 | 20 | 3.08 | 1630 | 0.00188957 |
| 5 | 1.2 | 0.298 | 10.1 | 3.0098 | 1630 | 0.0018465 |
| 6 | 1.4 | Slope | 3.2 | — | — | — |

From Table 1, it can be confirmed that when a z value is more than 0 and 1.5 or less, the value of $f_r$ (magnetic resonance frequency) becomes a value corresponding to a band of several to tens of GHz. For example, in order to set the value of $f_r$ (magnetic resonance frequency) to be 24 GHz, it can be seen that the value of $(\mu_s-1)$ has the closest value when z is 1. The value of $(\mu_s-1)$ when the value of $f_r$ (magnetic resonance frequency) is 24 GHz may be theoretically calculated using Snoek's Law, and the calculated value of $(\mu_s-1)$ is preferably 0.128.

Accordingly, several samples in which the content of each of Sr and La was adjusted in the composition in the case of z of 1 were manufactured, and an experiment was conducted to obtain the sample having the value of $(\mu_s-1)$ that was close to 0.128. The results are shown in FIG. 1.

Figure 1:
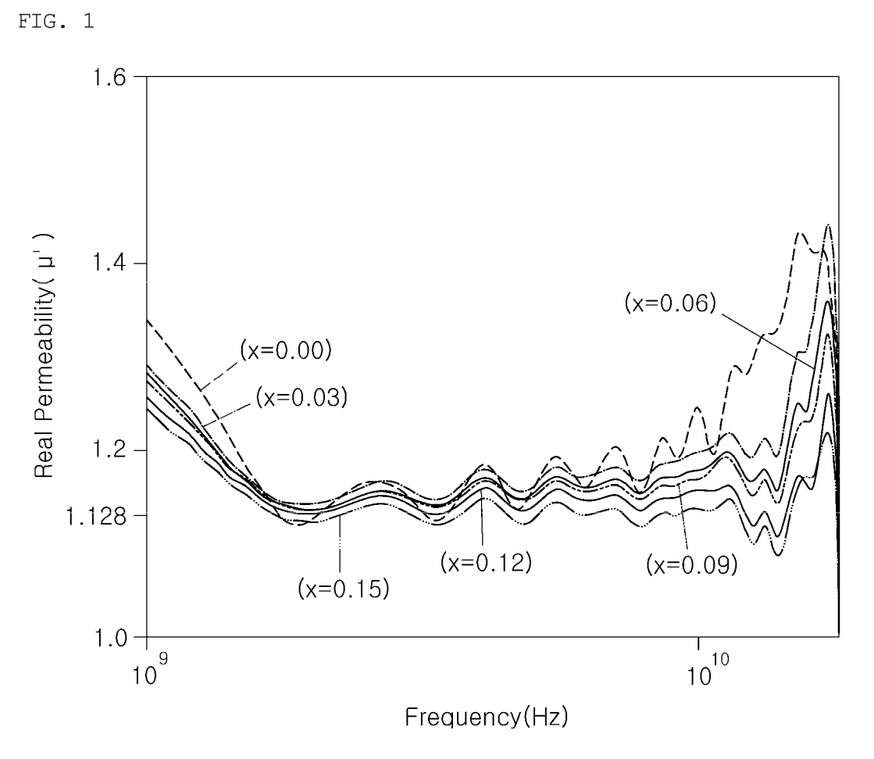
FIG. 1 is a graph showing a change in magnetic permeability depending on a change in content of Sr and La in electromagnetic-wave-absorbing particles.

FIG. 1 is a graph showing a change in magnetic permeability depending on a change in the content of Sr and La in electromagnetic-wave-absorbing particles.

As can be seen from FIG. 1, the $\mu_s$ value was gradually decreased as the amount of La was increased, and when x was 0.15, a value close to 0.128, which was the theoretical value of $(\mu_s-1)$ when the value of $f_r$ (magnetic resonance frequency) was 24 GHz, was obtained, that is, a value close to 1.128, which was the theoretical value of $\mu_s$, was obtained. $\mu_s$ means the value of the real-number part of magnetic permeability in the vicinity of an area where the real-number part of magnetic permeability is not significantly changed for a frequency.

Therefore, it can be confirmed that the absorbing particles exhibiting an absorption mechanism caused by a ferromagnetic resonance phenomenon at 24 GHz have a composition of $Sr_{0.85}La_{0.15}Fe_9Zn_{1.0}Ti_{1.0}O_{19}$.

Based on this, it can be seen that absorbing particles in which the value of x is 0.094 and the value of z is 1.2 have the highest absorption ability in a band of 9 to 10.5 GHz.

Next, for the purpose of matching the impedance of the absorbing material including the absorbing particles and the polymer resin mixed therein, the permittivity of the absorbing material was controlled.

In this embodiment, graphite was added as a permittivity-adjusting agent to the absorbing material in order to control the permittivity of the absorbing material.

The absorbing material was manufactured so as to have a composition of $Sr_{0.906}La_{0.094}Fe_{9.8}Zn_{0.6}Ti_{0.6}O_{19}$, and the amount of graphite mixed with the absorbing material was changed to measure changes in magnetic permeability and permittivity.

Figure 2A:
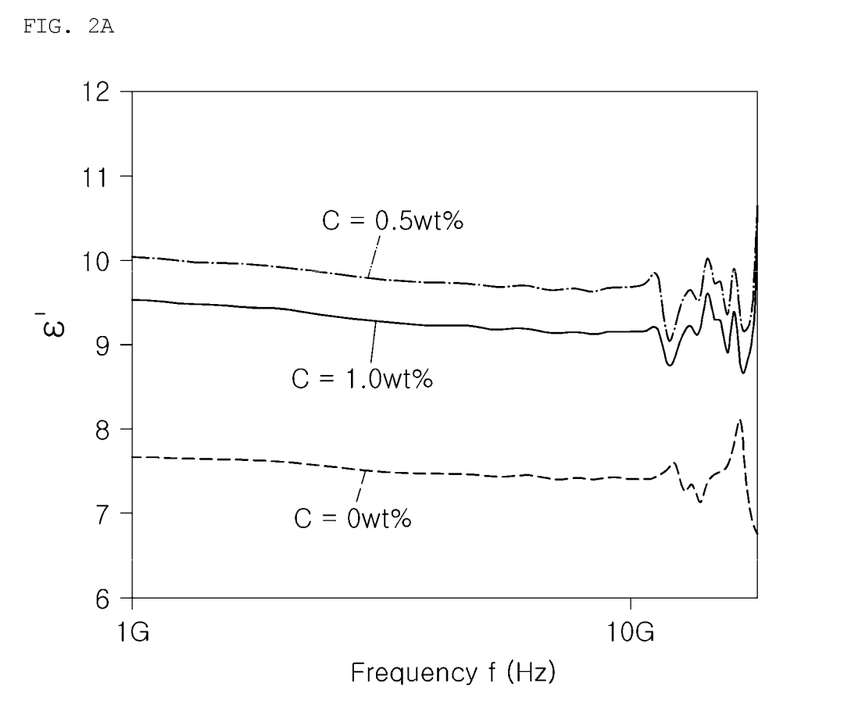
FIGS. 2A and 3A are graphs showing a change in the real-number part of permittivity depending on a change in the mixing amount of graphite in an electromagnetic-wave-absorbing material.
Figure 2B:
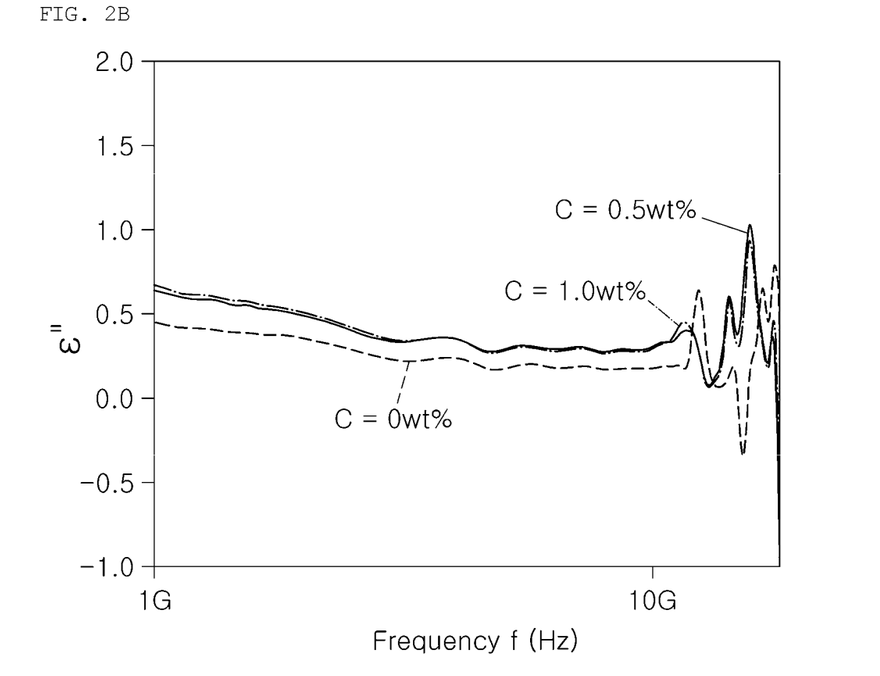
FIGS. 2B and 3B are graphs showing a change in the imaginary-number part of permittivity depending on a change in the mixing amount of graphite in an electromagnetic-wave-absorbing material.
Figure 2C:
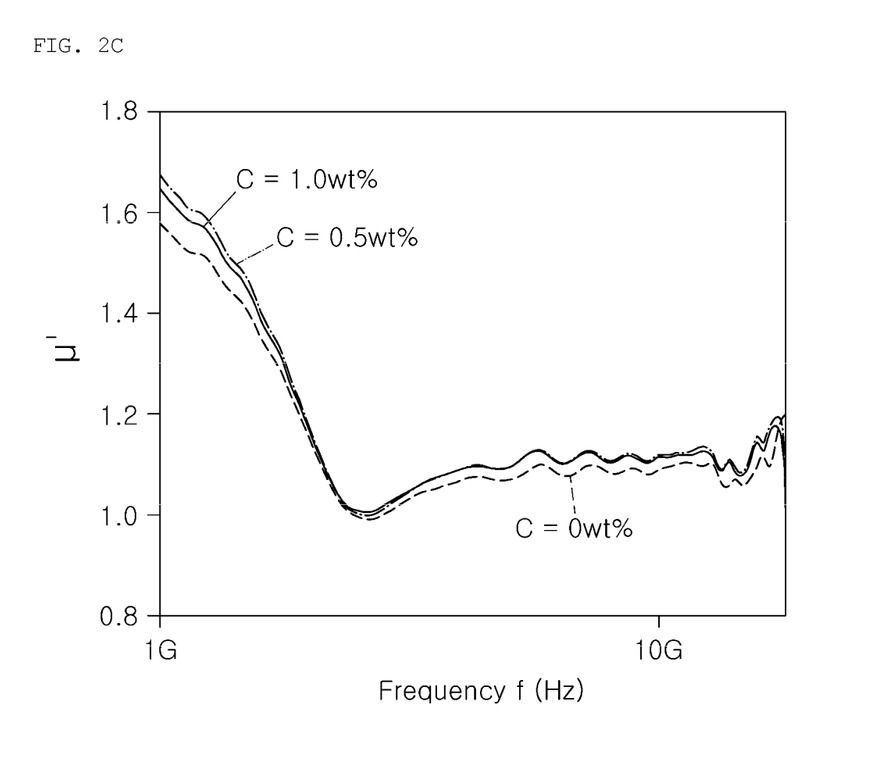
FIGS. 2C and 3C are graphs showing a change in the real-number part of magnetic permeability depending on a change in the mixing amount of graphite in an electromagnetic-wave-absorbing material.
Figure 2D:
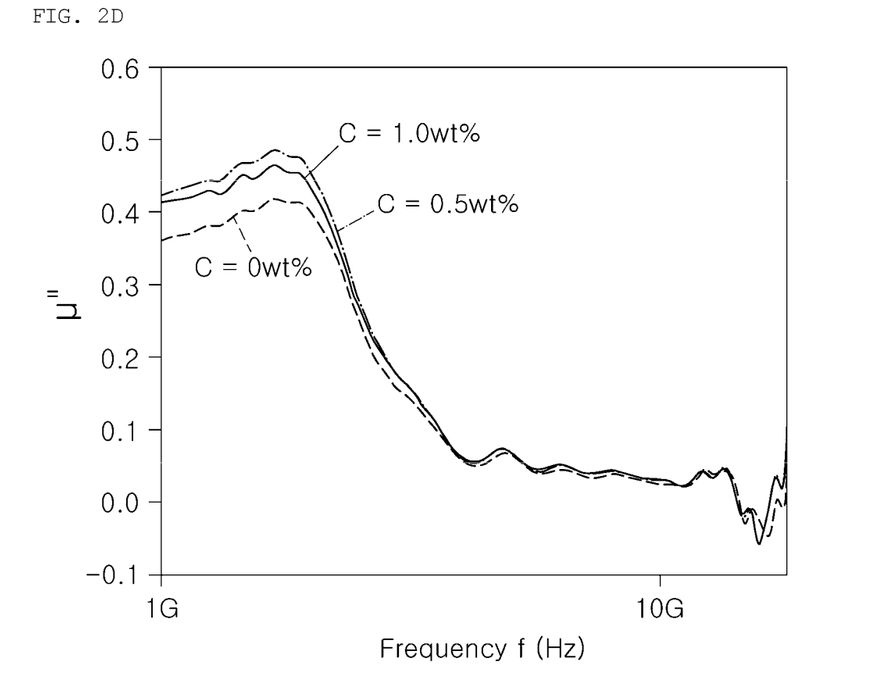
FIGS. 2D and 3D are graphs showing a change in the imaginary-number part of magnetic permeability depending on a change in the mixing amount of graphite in an electromagnetic-wave-absorbing material.

FIG. 2A is a graph showing a change in the real-number part of permittivity depending on a change in the mixing amount of graphite in an electromagnetic-wave-absorbing material. FIG. 2B is a graph showing a change in the imaginary-number part of permittivity depending on a change in the mixing amount of graphite in an electromagnetic-wave-absorbing material. FIG. 2C is a graph showing a change in the real-number part of magnetic permeability depending on a change in the mixing amount of graphite in an electromagnetic-wave-absorbing material. FIG. 2D is a graph showing a change in the imaginary-number part of magnetic permeability depending on a change in the mixing amount of graphite in an electromagnetic-wave-absorbing material.

As can be confirmed from FIGS. 2A to 2D, when the mixing amount of graphite is changed, the magnetic permeability is hardly changed, but the permittivity is changed.

Therefore, it can be confirmed that the permittivity is adjusted without changing the magnetic permeability of the absorbing material by mixing the graphite as the permittivity-adjusting agent and appropriately adjusting the mixing amount thereof.

Meanwhile, even when the value of $f_r$ (magnetic resonance frequency) of the absorbing particles coincides with the frequency of the electromagnetic wave to be absorbed, the absorbing particles may not significantly absorb the electromagnetic wave at the value of $f_r$ (magnetic resonance frequency). Accordingly, it is necessary to match the impedance in a vacuum with the impedance of the absorbing material.

The impedance $(Z_o)$ in a vacuum and the impedance $(Z_{in})$ of the absorbing particles may be calculated using the following [Relational Expression].

$$Z_{in}/Z_0 = \sqrt{\mu_r/\varepsilon_r} \tanh[j(2\pi fd/c)\sqrt{\mu_r\varepsilon_r}] \quad \text{[Relational Expression]}$$

Accordingly, in order to match the impedance $(Z_o)$ in a vacuum and the impedance $(Z_{in})$ of the absorbing particles, the value of $Z_{in}/Z_o$ may be adjusted to be as close to 1 as possible, thereby obtaining the material having the highest absorption rate of electromagnetic waves in the desired frequency band.

What can be inferred from the above Relational Expression is that the value of $Z_{in}/Z_o$ is adjusted by adjusting the permittivity in the state in which the magnetic permeability is not changed.

Therefore, when graphite is used as the permittivity-adjusting agent, as in the previous description, the permittivity is capable of being changed alone without changing magnetic permeability. Accordingly, the value of $Z_{in}/Z_o$ may be adjusted to a value that is as close to 1 as possible by mixing graphite with the absorbing material, so that the absorption rate may coincide with the $f_r$ (magnetic resonance frequency) of the absorbing material in the desired frequency band.

In addition, in this embodiment, in order to control the permittivity of the absorbing material, graphite may be added as a permittivity-adjusting agent to the absorbing material, and a reaction accelerator for promoting the reaction of the permittivity-adjusting agent may be further added thereto.

It is preferable that the reaction accelerator be contained in an amount of 6 to 7 wt % based on 100 wt % of the mass of electromagnetic-wave-absorbing particles. In addition, for example, a "Dyhard" model may be used as the reaction accelerator.

The absorbing material was manufactured so as to have a composition of $Sr_{0.906}La_{0.094}Fe_{9.8}Zn_{0.6}Ti_{0.6}O_{19}$, and the amount of graphite mixed with the absorbing material that was mixed with 6.7 wt % of the reaction accelerator in advance was changed to measure changes in magnetic permeability and permittivity.

Figure 3A:
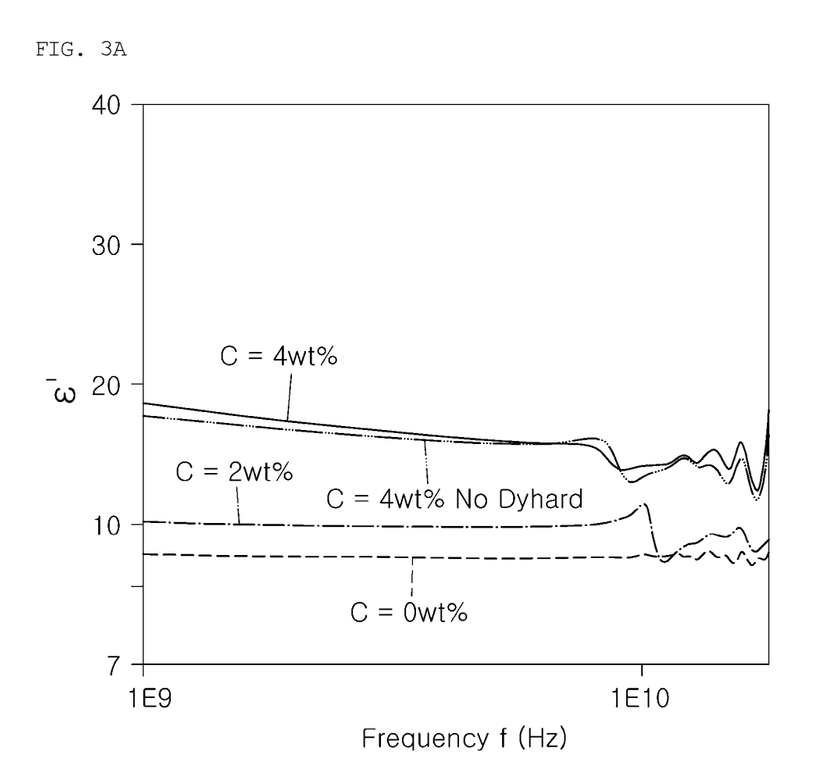
Figure 3B:
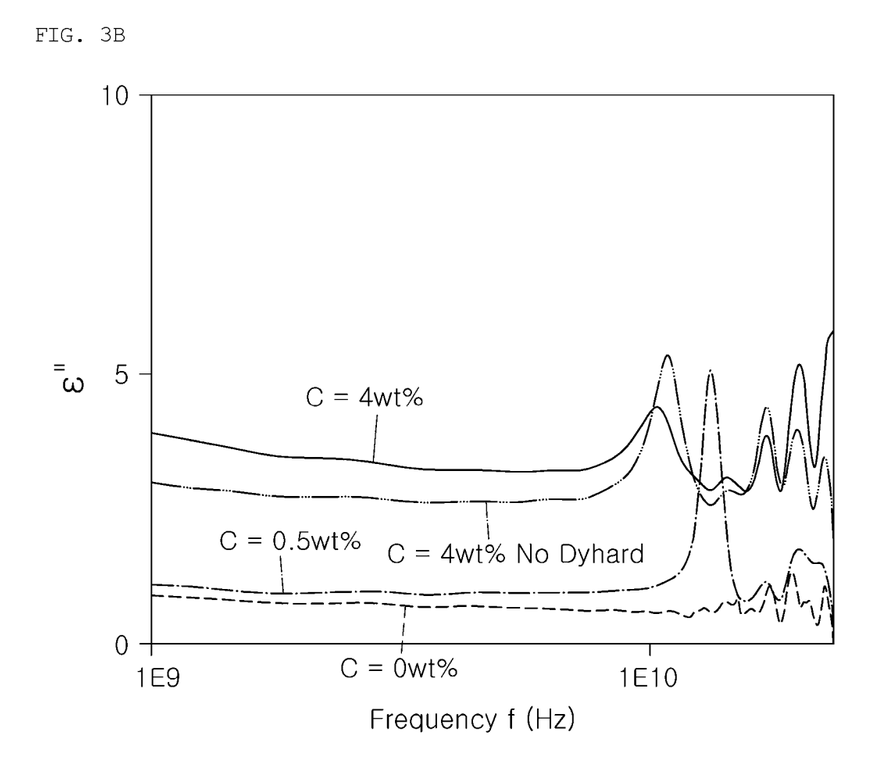
Figure 3C:
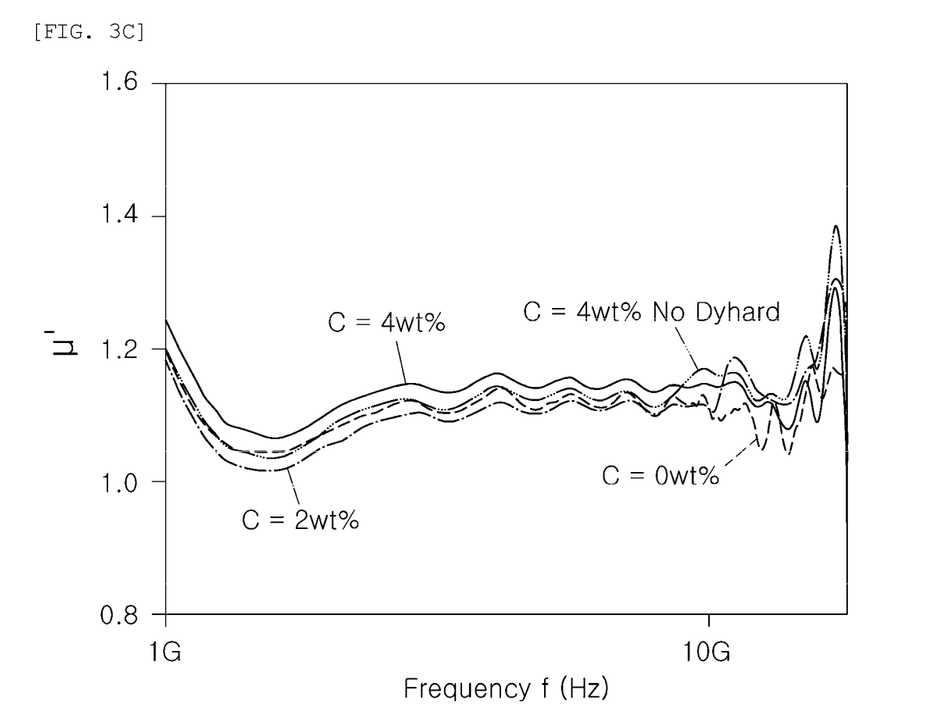
Figure 3D:
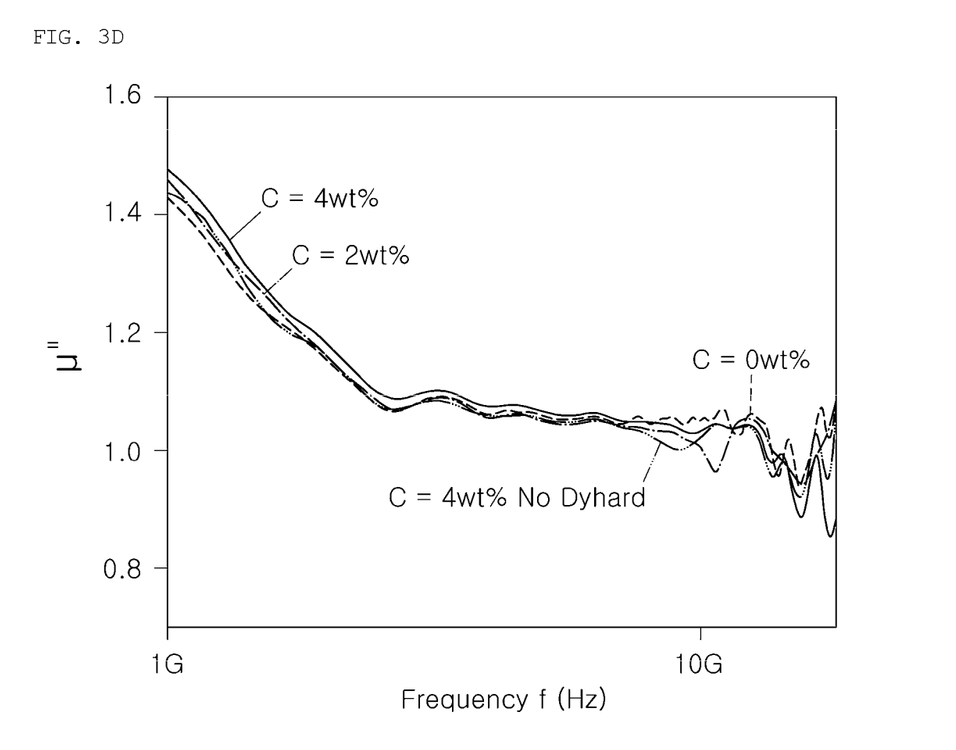

FIG. 3A is a graph showing a change in the real-number part of permittivity depending on a change in the mixing amount of graphite in an electromagnetic-wave-absorbing material. FIG. 3B is a graph showing a change in the imaginary-number part of permittivity depending on a change in the mixing amount of graphite in an electromagnetic-wave-absorbing material. FIG. 3C is a graph showing a change in the real-number part of magnetic permeability depending on a change in the mixing amount of graphite in an electromagnetic-wave-absorbing material. FIG. 3D is a graph showing a change in the imaginary-number part of magnetic permeability depending on a change in the mixing amount of graphite in an electromagnetic-wave-absorbing material.

As can be confirmed from FIGS. 3A to 3D, when the mixing amount of graphite is changed, the magnetic permeability is hardly changed, but the permittivity is changed.

Therefore, it can be confirmed that the permittivity is adjusted without changing the magnetic permeability of the absorbing material by mixing the graphite as the permittivity-adjusting agent and appropriately adjusting the mixing amount thereof in the state in which the absorbing material is mixed with the reaction accelerator.

Next, the reflection loss of the absorbing material that was mixed with graphite as the permittivity-adjusting agent while changing the mixing amount of the graphite was measured.

The absorbing material was manufactured so as to have a composition of $Sr_{0.906}La_{0.094}Fe_{9.8}Zn_{0.6}Ti_{0.6}O_{19}$, and the amount of graphite mixed with the absorbing material was changed to measure changes in magnetic permeability and reflection loss.

As can be confirmed from FIGS. 3A to 3D, when the mixing amount of graphite is changed, the permittivity is changed.

As can be confirmed from FIG. 3C, further, an absorbing material having the maximum absorption rate in a band of about 8, 9, and 15 GHz may be obtained depending on the amount of the graphite that is added.

Therefore, when the graphite is added as the permittivity-adjusting agent, it can be confirmed that it is possible to effectively absorb electromagnetic waves in a band of several to tens of GHz when the graphite is contained in an amount of 5 wt % or less based on 100 wt % of the mass of the electromagnetic-wave-absorbing particles.

Next, the permittivity and reflection loss of the absorbing material that was mixed with the graphite as the permittivity-adjusting agent while changing the mixing amount of the graphite were measured.

The absorbing material was manufactured so as to have a composition of $Sr_{0.906}La_{0.094}Fe_9Co_{1.0}Ti_{1.0}O_{19}$, and the amount of the graphite that was mixed with the absorbing material was changed to measure changes in magnetic permeability and reflection loss.

Figure 4A:
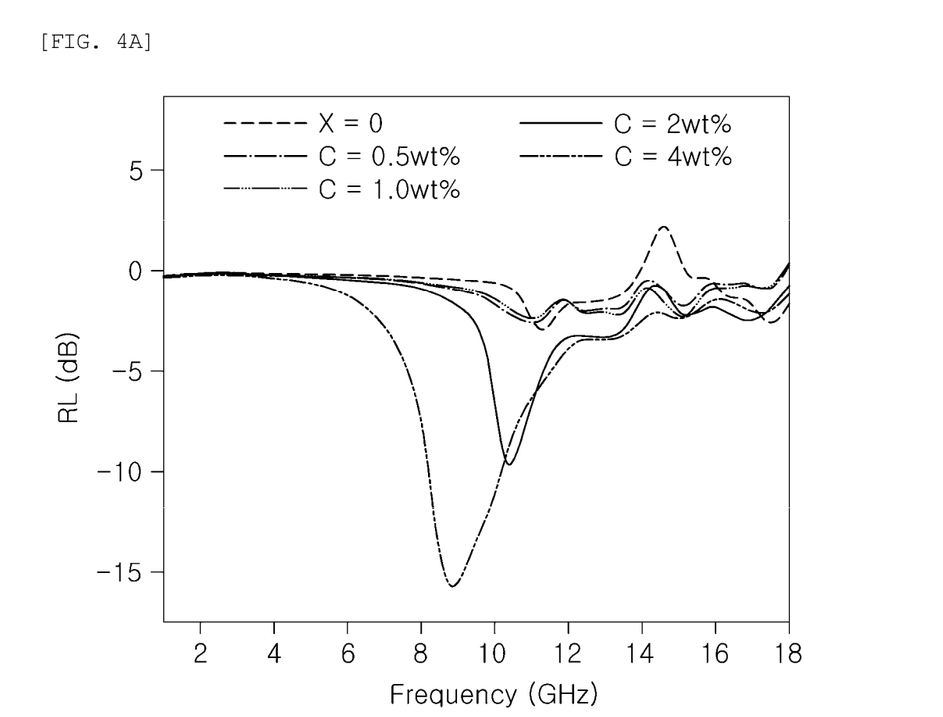
FIGS. 4A and 4B are graphs showing a change in reflection loss value depending on a change in the mixing amount of graphite in an electromagnetic-wave-absorbing material.
Figure 4B:
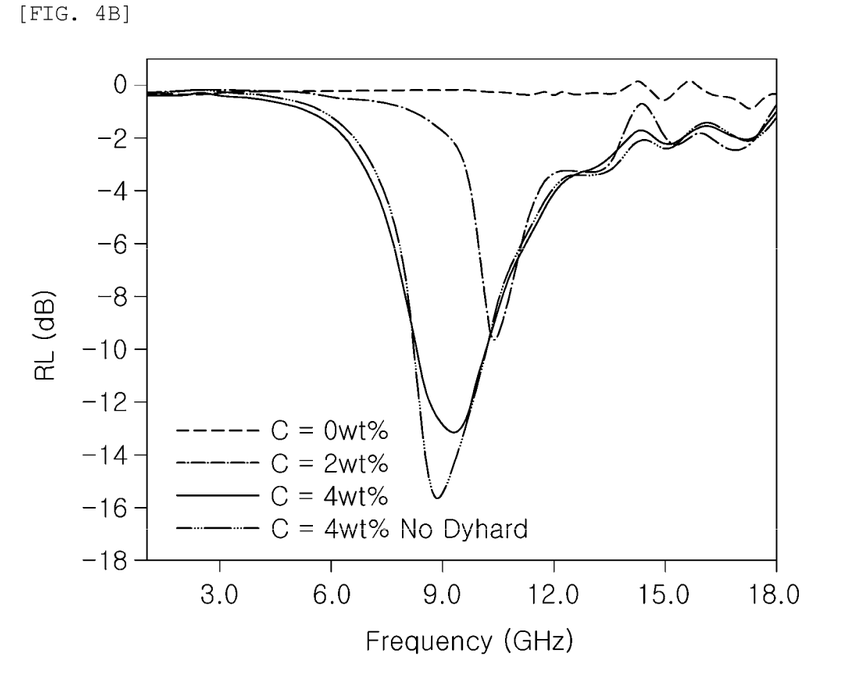

FIGS. 4A and 4B are graphs showing a change in reflection loss value depending on a change in the mixing amount of graphite in an electromagnetic-wave-absorbing material.

As can be confirmed from FIGS. 4A and 4B, an absorbing material having the maximum absorption rate in a band of about 9 to 10.5 GHz may be obtained depending on the amount of the graphite that is added.

Therefore, when the graphite is added as the permittivity-adjusting agent, it can be confirmed that it is possible to effectively absorb electromagnetic waves in a band of several to tens of GHz when the graphite is contained in an amount of 5 wt % or less, and preferably 2.0 to 5.0 wt % based on 100 wt % of the mass of the electromagnetic-wave-absorbing particles.

In addition, as can be confirmed from FIG. 4B, when the graphite is added as the permittivity-adjusting agent, it is possible to finely adjust the band in which electromagnetic waves are maximally absorbed or to adjust the maximum absorption amount thereof by comparing the case in which the reaction accelerator is used with the case in which the reaction accelerator is not used.

Therefore, when the reaction accelerator is added, it can be confirmed that it is possible to effectively absorb electromagnetic waves in a band of several to tens of GHz and to adjust the maximum absorption band and absorption amount thereof when the reaction accelerator is contained in an amount of 6.0 to 7.0 wt % based on 100 wt % of the mass of the electromagnetic-wave-absorbing particles.

Although the present disclosure has been described with reference to the accompanying drawings and the above-described preferred embodiments, the present disclosure is not limited thereto, but is limited by the claims to be described later. Therefore, various modifications and variations of the present disclosure can be made by those of ordinary skill in the art within the scope of the technical spirit of the claims to be described later.

What is claimed is:

1. Electromagnetic-wave-absorbing particles for a GHz band, which are represented by [Empirical Formula 2] below and which include M-type hexaferrite as a major phase:

$$Sr_{1-x}R_xFe_{y-2z}Zn_zTi_zO_{19}, \qquad \text{[Empirical Formula 2]}$$

wherein R is one or more selected from Ba, Ca, and La, 0<x≤0.8, 8≤y≤14, and 0<z≤1.5.

2. The electromagnetic-wave-absorbing particles of claim 1, wherein, when a value of z is 0.6, the electromagnetic-wave-absorbing particles maximally absorb an electromagnetic wave in a band of 9 to 10.5 GHz.

3. The electromagnetic-wave-absorbing particles of claim 2, wherein the electromagnetic-wave-absorbing particles have a value of x between 0.094 to 0.15.

4. An electromagnetic-wave-absorbing material for a GHz band, comprising:
a polymer resin; and
electromagnetic-wave-absorbing particles, which are mixed with the polymer resin and are represented by [Empirical Formula 2] below and which include M-type hexaferrite as a major phase:

$$Sr_{1-x}R_xFe_{y-2z}Zn_zTi_zO_{19}, \qquad \text{[Empirical Formula 2]}$$

wherein R is one or more selected from Ba, Ca, and La, 0<x≤0.8, 8≤y≤14, and 0<z≤1.5.

5. The electromagnetic-wave-absorbing material of claim 4, further comprising a permittivity-adjusting agent.

6. The electromagnetic-wave-absorbing material of claim 5, wherein the permittivity-adjusting agent is graphite.

7. The electromagnetic-wave-absorbing material of claim 6, wherein the permittivity-adjusting agent is contained in an amount of 5.0 wt % or less based on 100 wt % of a mass of electromagnetic-wave-absorbing particles.

8. The electromagnetic-wave-absorbing material of claim 7, wherein the permittivity-adjusting agent is contained in an amount of 2.0 to 5.0 wt % based on 100 wt % of the mass of the electromagnetic-wave-absorbing particles.

9. The electromagnetic-wave-absorbing material of claim 7, wherein the electromagnetic-wave-absorbing material absorbs an electromagnetic wave in a band of 24 GHz.

10. The electromagnetic-wave-absorbing material of claim 5, further comprising a reaction accelerator for accelerating a reaction of the permittivity-adjusting agent.

11. The electromagnetic-wave-absorbing material of claim 10, wherein the reaction accelerator is contained in an amount of 6.0 to 7.0 wt % based on 100 wt % of a mass of electromagnetic-wave-absorbing particles.

* * * * *